US008492744B2

(12) United States Patent
Eden et al.

(10) Patent No.: US 8,492,744 B2
(45) Date of Patent: Jul. 23, 2013

(54) SEMICONDUCTING MICROCAVITY AND MICROCHANNEL PLASMA DEVICES

(75) Inventors: J. Gary Eden, Champaign, IL (US); Paul Tchertchian, Mission Viejo, CA (US); Clark J. Wagner, Champaign, IL (US); Steve Solomon, Goleta, CA (US); Robert Ginn, Ventura, CA (US)

(73) Assignees: The Board of Trustees of the University of Illinois, Urbana, IL (US); Acumen Scientific, Goleta, CA (US)

( * ) Notice: Subject to any disclaimer, the term of this patent is extended or adjusted under 35 U.S.C. 154(b) by 231 days.

(21) Appl. No.: 12/915,630

(22) Filed: Oct. 29, 2010

(65) Prior Publication Data

US 2011/0140073 A1 Jun. 16, 2011

Related U.S. Application Data

(60) Provisional application No. 61/255,945, filed on Oct. 29, 2009.

(51) Int. Cl.
*H01L 29/12* (2006.01)

(52) U.S. Cl.
USPC ........................ 257/10; 257/E29.166; 438/20

(58) Field of Classification Search
USPC ............................... 257/10, E29.166; 438/20
See application file for complete search history.

(56) References Cited

U.S. PATENT DOCUMENTS

| | | | |
|---|---|---|---|
| 4,683,399 | A | 7/1987 | Soclof |
| 5,561,348 | A | 10/1996 | Schoenbach et al. |
| 5,841,219 | A | 11/1998 | Sadwick et al. |
| 5,969,378 | A | 10/1999 | Singh |
| 6,538,367 | B1 | 3/2003 | Choi et al. |
| 6,577,058 | B2 | 6/2003 | Ossipov et al. |
| 6,815,891 | B2 | 11/2004 | Eden et al. |
| 7,112,918 | B2 | 9/2006 | Eden et al. |
| 7,126,266 | B2 | 10/2006 | Park et al. |
| 2001/0040431 | A1 | 11/2001 | Xu et al. |
| 2004/0206959 | A1 | 10/2004 | Heeger et al. |
| 2010/0289413 | A1 | 11/2010 | Eden et al. |

FOREIGN PATENT DOCUMENTS

| | | |
|---|---|---|
| EP | 1486755 | 12/2004 |
| WO | WO 2009/055807 | 4/2009 |

OTHER PUBLICATIONS

Chen; K.-F., et. al., "The plasma transistor: A microcavity plasma device coupled with a low voltage, controllable electron emitter", *Applied Physics Letters* 93, 161501, 2008.
PHYSORG.com, "Scietists fabricate fust plasma transistor", PHYSorg.com, Nov. 12, 2008, http://www.physorg.com/news145705718.html.
Science Daily, "New Plasma Transistor Could Create Sharper Displays", sciencedaily.com, Feb. 17, 2009, http://www.sciencedaily.com/releases/2009/02/090204131617.htm.

*Primary Examiner* — Howard Weiss
(74) *Attorney, Agent, or Firm* — Greer, Burns & Crain Ltd.

(57) ABSTRACT

Preferred embodiments of the invention provide semiconducting microcavity plasma devices. Preferred embodiments of the invention are microcavity plasma devices having at least two pn junctions, separated by a microcavity or microchannel and powered by alternate half-cycles of a time-varying voltage waveform. Alternate embodiments have a single pn junction. Microplasma is produced throughout the cavity between single or multiple pn junctions and a dielectric layer isolates the microplasma from the single or multiple pn junctions. Additional preferred embodiments are devices in which the spatial extent of the plasma itself or the n or p regions associated with a pn junction are altered by a third (control) electrode.

26 Claims, 15 Drawing Sheets

Top View
Cross-Sectional View 11
38
Start with Silicon on Insulator (SOI) Wafer

42

11
38
Oxidize Wafer

44

44
42
11
38
Selectively etch oxide

42

44
11
Selectively etch silicon

20
Perform diffusion
n-type silicon
p-type silicon
44

20

16
11
Cavity
Selectively etch silicon 11
16
22
11
20
38
Deposit or Grow Dielectric Layer Oxidize Silicon Wafer Etch pattern in oxide Perform partial Si etch Perform diffusion Continue etching Si
to final depth Remove all oxide Perform oxidation or deposit
dielectric layer Perform partial etch Perform n-type diffusion Etch remainder of cavity & Coat Dielectric

SEMICONDUCTING MICROCAVITY AND MICROCHANNEL PLASMA DEVICES

PRIORITY CLAIM AND REFERENCE TO RELATED APPLICATION

The application claims priority under 35 U.S.C. §119 from prior provisional application Ser. No. 61/255,945, which was filed on Oct. 29, 2009.

STATEMENT OF GOVERNMENT INTEREST

This invention was made with government support under Contract No. W91ZLK-07-C-006-P00002 awarded by the United States Army Research Office and under Grant No. FA9550-07-1-0003 awarded by the United States Air Force Office of Scientific Research. The government has certain rights in the invention.

FIELD

Fields of the invention include semiconductors, optoelectronics, microelectronics, plasma electronics, and microcavity plasma devices (also referred to as microplasma devices or microdischarge devices).

BACKGROUND

Microcavity plasma devices have been developed and advanced by researchers at the University of Illinois, including inventors of this application. One segment of this research has resulted in microcavity plasma devices and arrays of microcavity plasma devices fabricated in semiconductor materials. Particular microcavity plasma devices having tapered sidewall microcavities fabricated in semiconductor materials are disclosed in U.S. Pat. No. 7,112,918 (the '918 patent), issued on Sep. 26, 2006 and entitled Microdischarge Devices and Arrays Having Tapered Microcavities.

The '918 patent describes microdischarge devices and arrays of microdischarge devices that have tapered cavities. The tapered cavities include pyramidal cavities, and are relatively inexpensive and easy to fabricate using conventional semiconductor processing techniques. Tailoring of the electrical properties of the microcavity devices by variation of the tapered microcavity cross-section is possible. The '918 patent also describes a microcavity plasma device formed from a semiconductor diode. A cavity is formed that extends through the depletion region of the reversed-biased diode and the surface of at least one of the semiconductor layers. The diodes are reverse-biased so as to ignite gas in the microcavity. The electric field is most intense in the depletion region of a reverse-biased diode. Unfortunately, switching and modulation of these devices requires substantial voltages (about 200 V) and electronics capable of switching such voltages are expensive.

Microplasma devices powered by a reverse-biased pn junction were also described in U.S. Pat. No. 6,815,891 issued on Nov. 9, 2004 and entitled, "Method and Apparatus for Exciting a Microdischarge." For this invention, the gas within a channel extending through a semiconductor pn junction is excited by the electric field produced when the pn junction is reverse-biased. The microplasma thus produced is exposed to the semiconductor wall of the channel and plasma is produced in the channel in the vicinity of the pn junction.

Others have produced semiconductor structures that conduct electrons through space in a vacuum. Examples are described in U.S. Pat. No. 6,577,058 (the '058 patent) to Ossipov et al., and U.S. Pat. No. 4,683,399 (the '399 patent) granted to Soclof. In the '399 patent, a semiconductor device is disposed in a hermetically sealed container enclosing a vacuum. The device provides an emitter which emits electrons into vacuum and a collector to receive the electrons. The '058 patent discloses a cold electron emitter that also operates in vacuum. The emitter includes a junction that can control electron emission into the vacuum. Electron emitters such as those in the '399 and '058 patents can be used to produce displays, but require operation in a vacuum.

SUMMARY OF THE INVENTION

Preferred embodiments of the invention provide semiconducting microcavity plasma devices. Preferred embodiments of the invention are microcavity plasma devices having at least two pn junctions, separated by a microcavity or microchannel and powered by alternate half-cycles of a time-varying voltage waveform. Alternate embodiments have a single pn junction. Microplasma is produced throughout the cavity between single or multiple pn junctions and a dielectric layer isolates the microplasma from the single or multiple pn junctions. Additional preferred embodiments are devices in which the spatial extent of the plasma itself or the n or p regions associated with a pn junction are altered by a third (control) electrode.

A preferred method for creating a conduction channel between n-type semiconductor regions separated by p-type material defining one, two or more pn junctions proximate a microcavity or a microchannel includes reverse biasing a first one of the one, two, or more pn junctions with a voltage sufficient to drive a plasma in the microcavity or microchannel in a first cycle while removing bias in a second cycle, and shorting or floating a second one or more of the two pn junctions if more than one junction is present. Alternately repeating the steps of reverse biasing and removing bias maintains microplasma in the microchannel or microcavity.

Additional preferred embodiment semiconducting microplasma devices of the invention include one, two or more n-type regions separated by a p-type region forming one, two or more pn junctions. Thin dielectric separates the one, two or more n-type regions and the p-type region from a microplasma generation area above the n-type region(s) and the p-type region. A gate electrode is separated from the p-type region by gate dielectric. A voltage source applies a time varying voltage to the one, two or more n-type regions to generate microplasma in the microplasma generation area.

DETAILED DESCRIPTION OF THE PREFERRED EMBODIMENTS

Figure 1:
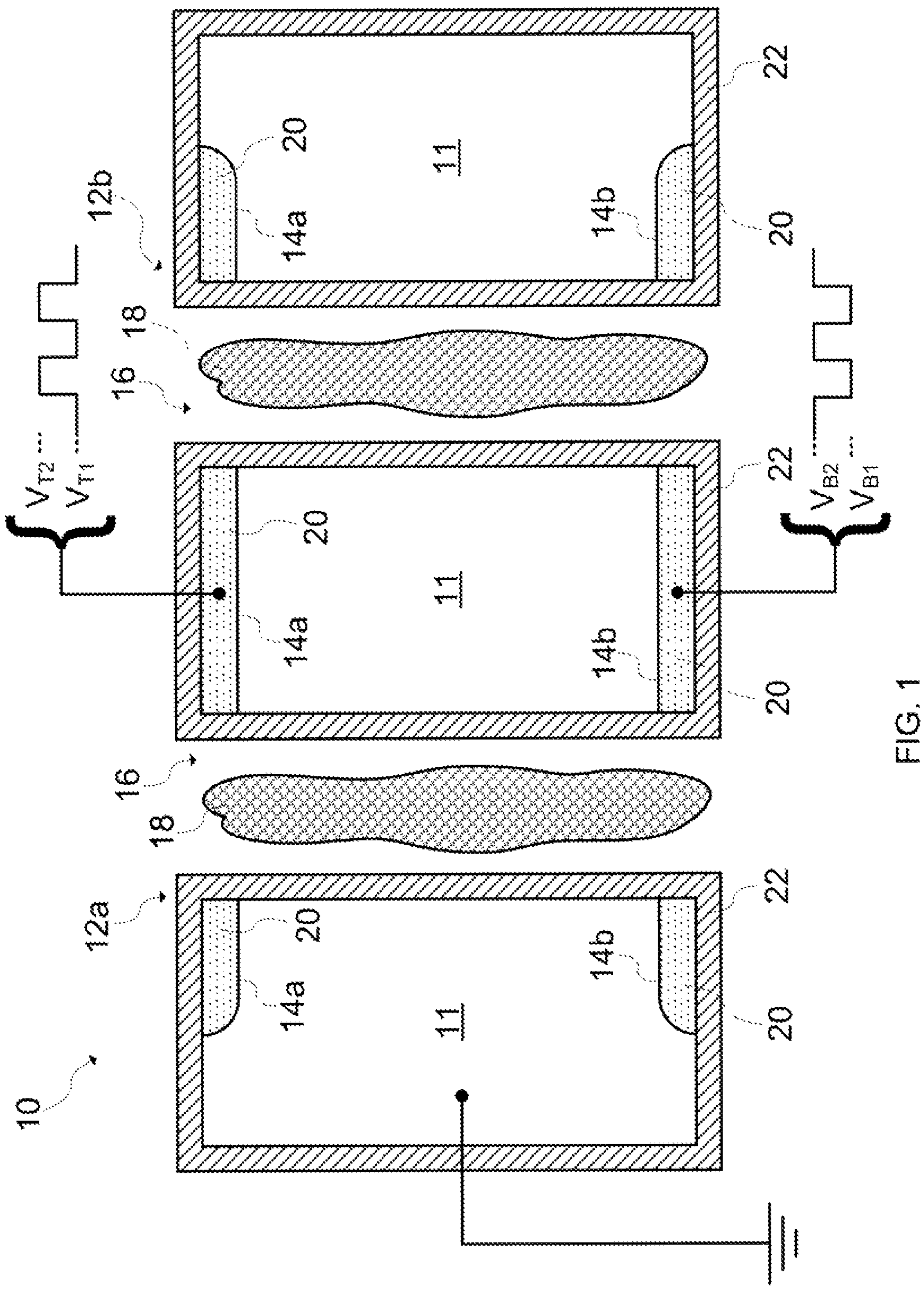
FIG. 1 is a schematic cross-sectional view of a preferred embodiment array of semiconducting microcavity plasma devices.

The invention provides semiconductor-plasma devices and arrays of semiconductor-plasma devices in which microplasmas are produced in regions, including microcavities or microchannels, excited by one or more pn junctions isolated from the plasma by dielectric that facilitates the collection and distribution of electrons along the surface of the dielectric. Preferred embodiments have two pn junctions powered by alternate half-cycles of a time-varying voltage waveform and separated by a microcavity or microchannel. Additional embodiments use additional (control) electrodes to vary the spatial extent of the n and p regions and thereby vary the plasma properties and brightness.

Semiconducting microcavity plasma devices of the invention can be fabricated by preferred embodiment fabrication methods that use process steps well-established in the VLSI and MEMS communities. Preferred embodiment arrays and devices of the invention can be fabricated in different semiconductor materials systems (i.e., elemental semiconductors, III-V compounds, organic semiconductors, etc.). Preferred embodiment devices are fabricated in silicon. In preferred applications of the invention, arrays of semiconducting microcavity or microplasma devices are addressable and well-suited as displays or microanalytical instruments (such as biomedical or environmental sensors).

Preferred embodiments of the invention will now be discussed with respect to the drawings. The drawings include schematic representations that will be understood by artisans in the context of the general knowledge in the art and the description that follows. Features may be exaggerated in the drawings for emphasis, and features may not be to scale. Artisans will recognize broader aspects of the invention from the description of the preferred embodiments. Additionally, artisans will recognize that certain terms, such as “top” and “bottom” are used for convenience of description, and while “top” is properly considered the opposite of “bottom”, neither “top” or “bottom” indicates a necessary positioning of an array or device of the invention relative to any other structure.

FIG. 1 illustrates a preferred array 10 of semiconducting microcavity plasma devices 12 of the invention. Two devices 12*a* and 12*b* are illustrated, but the array 10 can included many separate microcavity plasma devices, e.g. hundreds or thousands of devices. The array 10 of FIG. 1 can be fabricated in a single p-type wafer 11, and the two illustrated semiconducting microcavity plasma devices 12 include pn junctions 14*a* and 14*b* near the top and bottom of the wafer and two microcavities 16, one for each device. Since FIG. 1 is a cross-sectional diagram, it is understood that these two pn junctions 14*a* and 14*b* generally encompass the microcavities 16 and not just lie to the left and right of the microcavities 16. During operation, plasma 18 is produced within each microcavity 16. The shape of the plasma shown in FIG. 1 is purely for illustrative purposes, and is influenced by the shape of the microcavity 16, the applied voltage waveform, and the location and size of the pn junctions 14. The pn junctions 14 in the device 10 are formed by thin n-type regions 20 located near the top and bottom of the p-Si wafer around the microcavities 16 result in the formation of two pn junctions 14*a* and 14*b* for each microcavity plasma device 12 and the entire structure of FIG. 1. A layer of dielectric 22 protects and isolates the pn junctions 14 and the walls of microcavities 16 from the plasma 18. As seen in FIG. 1, the dielectric 22 can be formed as a layer around the entire device 10. The dielectric layer 22 can be deposited or grown on the surface and onto walls of the microcavity 16.

In the preferred embodiment of FIG. 1, two pn junctions 14*a* and 14*b* are common to both microplasma devices 12*a* and 12*b*. The p-Si regions of the wafer 11 are grounded and the top and bottom pn junctions 14*a* and 14*b* are driven with separate voltages. Although devices of the invention can be driven by any of a wide range of voltage waveforms, square waves are shown in FIG. 1 for convenience. Considering first the lower of the two pn junctions 14*b*, the voltage $V_{B2}$ is positive in the first half-cycle of the waveform and, therefore, the pn junction 14*b* extending along the bottom of the structure is reverse-biased. If the magnitude of $V_{B2}$ is sufficiently large, a microplasma 18 will be produced in each of the microcavities 16 because of the fringing electric field produced by the reverse-biased pn junction 14*b*.

Plasma is produced in gas(es), vapor(s), or combinations thereof in the microcavities. The desired pressure of the gas or vapor in a particular microcavity 16 is dependent upon the cross-sectional dimension of the microcavity 16. For a 100 μm diameter cylindrical microcavity, for example, the total pressure of a gas/vapor mixture is typically in the 200-1000 Torr range.

During the first half-cycle of the driving waveforms when the lower pn junctions 14*b* are reverse-biased, the upper pn junction 14*a* is shorted because $V_{T1}=0$. However, in the second half-cycle, $V_T>0$ and now the top junction 14*a* is reverse-biased. Consequently, a microplasma 18 is generated in the upper portion of the microcavity 16. However, negative charge deposited on the dielectric layer 22 on the lower portion of the microcavity wall (or still in the gas) during the first half-cycle of the waveform gives rise, in the second half-cycle, to an electric field extending from the top to the bottom of the microcavities 16 in FIG. 1. This field accelerates the electrons, remaining from the first half-cycle, towards the upper pn junction 14*a*, thereby producing a microplasma 18 along the entire length of the microcavity 16 and not just in the vicinity of the pn junction 14*a*.

The operation described above for the second half-cycle of both waveforms continues in the third half-cycle but now the role of the two sets of pn junctions 14*a* and 14*b* switches, and the microplasma 18 will continue to extend along the length of the microcavity 16. During this third half cycle and subsequent odd-numbered half cycles, the lower pn junction 14*b* is reverse-biased and residual negative charge (electrons) from the previous even-numbered half-cycle resides on the dielectric layer 22 on the walls cavity walls and in the gas. Thus, the electric field during odd half-cycles in the example sequence of driving voltage points upwards (bottom to top) and microplasma 18 is again generated along the entire length of the microcavity 16, not only in the vicinity of the lower, reverse-biased junction. The separation of two reverse-biased pn junctions by a microchannel or microcavity provides a mechanism to produce plasma along the entire microcavity and not solely in the vicinity of the pn junctions at the lower and upper portions of the microcavities.

Experiments have also shown that plasma will be generated with only one pn junction, as electrons still distribute along the dielectric layer 22. Though operation with two pn junctions produces higher intensity plasma, plasma is still generated with a single pn junction (either a device having only one junction or a device having one pn junction operating). Thus, embodiments of the invention include alternative single junction operation with decreased intensity but reduced complexity can be used where one of the pn junctions, e.g., the upper pn junction 14*a*, is either shorted or allowed to float during the entire cycle, or the upper junction is simply omitted. In this case, the plasma will only form from the excitation in the region of the lower junction 14*b* as the preferred case. The electrons generated by this operation will be deposited on the walls of the cavity 16 near the n region 20 during reverse bias of the lower junction 14*b* and will diffuse away from each other due to electrostatic repulsion when the bias is removed. During the next reverse half cycle the electrons in the cavity 16 will be accelerated back towards the n region producing plasma. The electrons won't be accelerated over as large an extent as in the preferred dual or more junction devices and operation, and the plasma is likely to be lower intensity, but plasma is still generated.

Artisans will also appreciate that more than two pn junctions can be formed along the walls of a microcavity, for example. Such a plurality of junctions can be driven in a manner that contributes to cooperative generation and distribution of electrons along the dielectric surface.

Figures 2A, 2B:
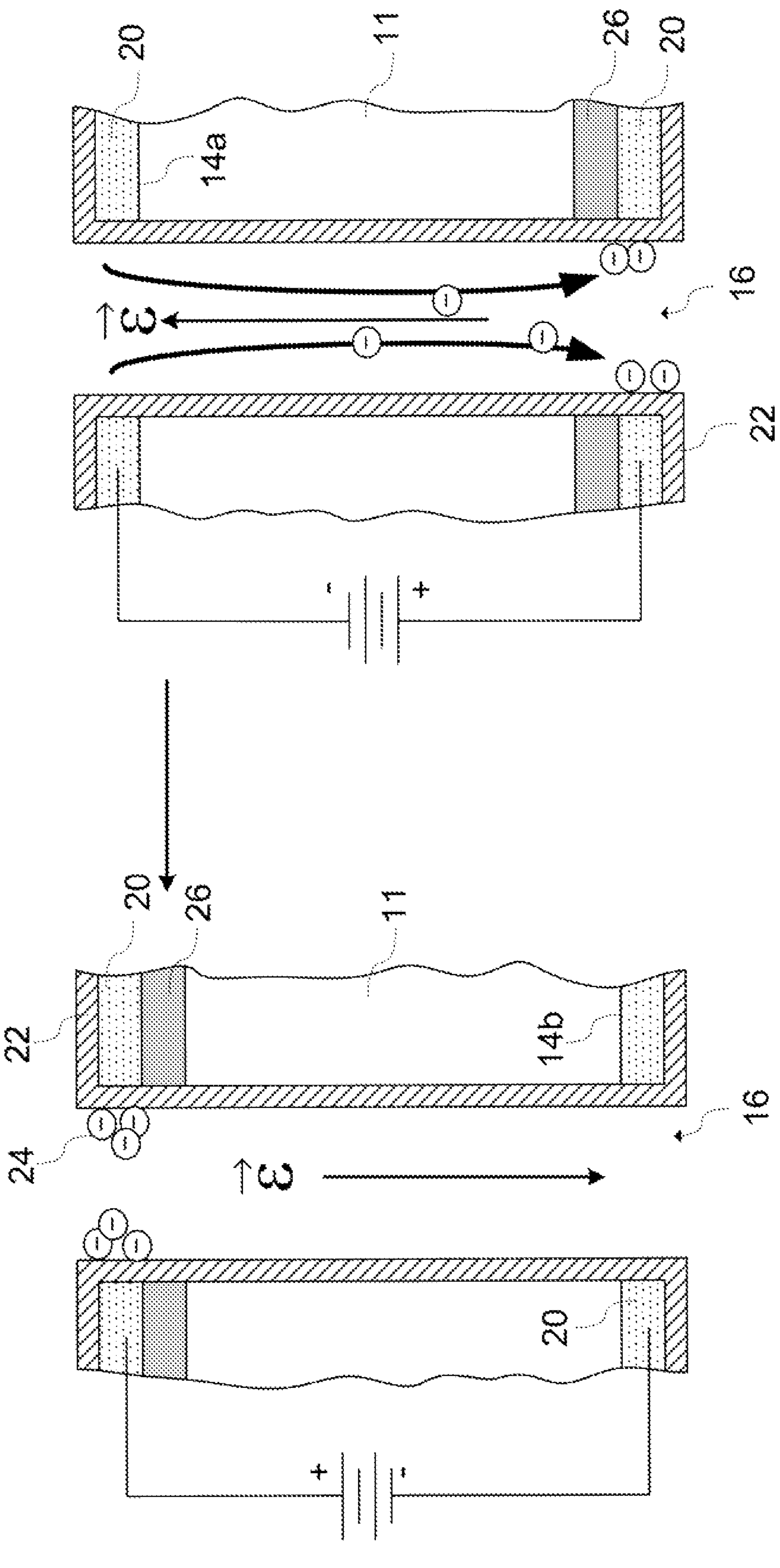
FIGS. 2A and 2B illustrate electron migration within a semiconducting microcavity or microchannel plasma device during alternate half-cycles of the driving voltage waveform.

FIG. 2A illustrates the migration of negative charge (electrons 24) between the top and bottom pn junctions 14*a* and 14*b*, which act as electrodes, as the voltages $V_T$ and $V_B$ of FIG. 1 alternate in polarity and a depletion region 26 forms at the top pn junction 14*a*. FIG. 2B illustrates the operation at the end of the second half-cycle of both voltage waveforms. At this point, the top n region 20 is biased positive with respect to the bottom n region 20. Negative charge is, therefore, attracted to the positive top electrode 14*a* and resides on the walls of the microcavity 16 as well as in the gas phase contained in the microcavity. In the following half-cycle, the lower n-type region 20 is biased positive with respect to the upper n region 20 and the electric field is now pointing upwards. Electrons 24 are accelerated towards the bottom n region. 20, undergoing collisions along the way and contributing to plasma production. At the end of this half cycle, the electrons 24 reside on the dielectric in the vicinity of the lower pn junction 14*b*.

The dielectric layer 22 in FIGS. 1, 2A and 2B serves a number of functions including: passivating the semiconductor, protecting the semiconductor surface, and enhancing the secondary electron emission coefficient. Without the dielectric layer 22, the migration of negative charge between the two n regions 20 of the upper and lower pn junctions 14*a* and 14*b* would not occur or would be severely hampered. The devices would still operate, however, microplasma would predominantly be produced only in the region of the microcavity in close proximity to the pn junctions 14*a* and 14*b*.

Figure 3:
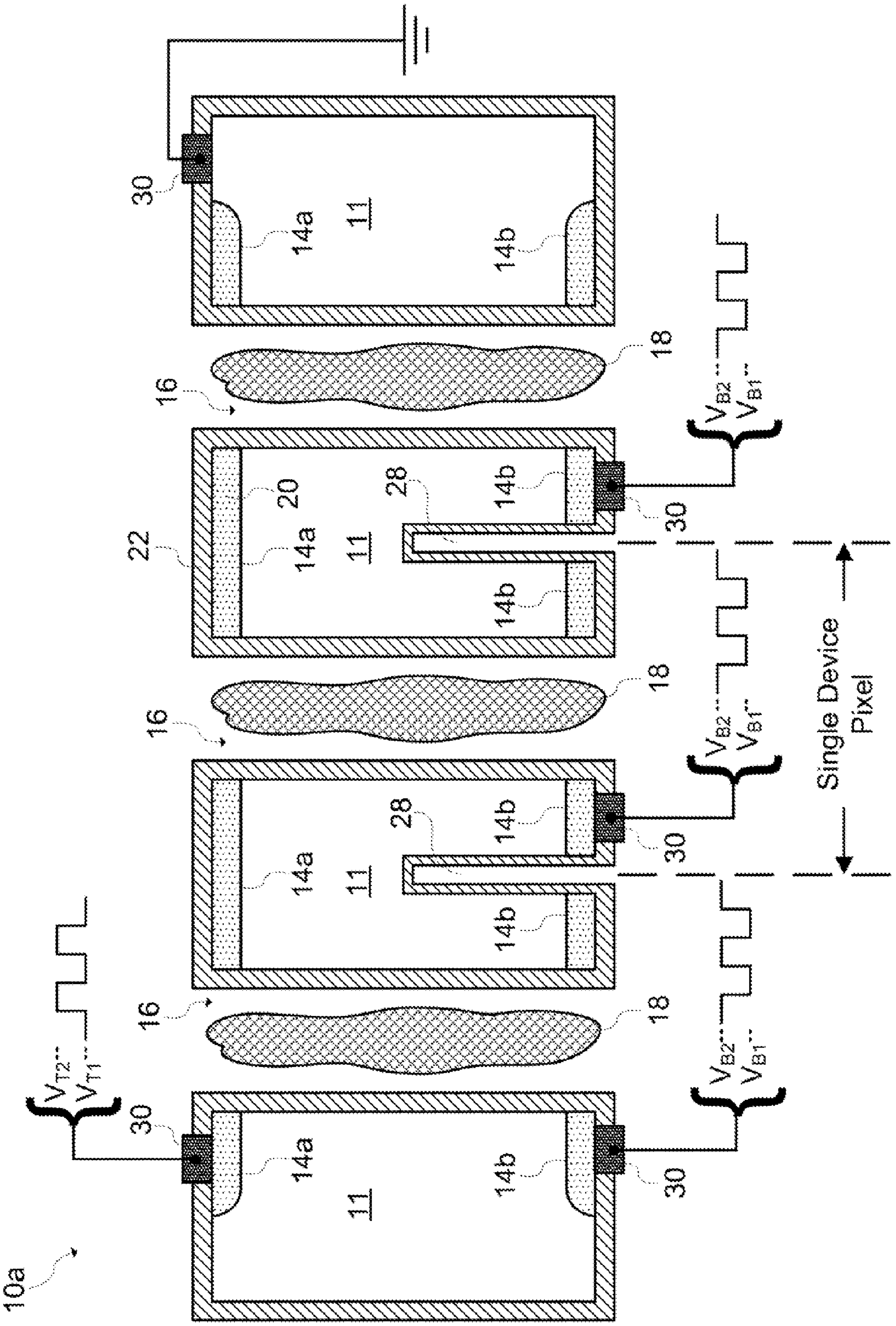
FIG. 3 is a schematic cross-sectional view of another preferred embodiment array of semiconducting microcavity plasma devices.

FIG. 3 illustrates another preferred embodiment array 10*a*, in which lower pn junctions 14*b* are isolated from each other by trenches 28 to create individually addressable pixels. FIG. 3 also illustrates contacts 30, e.g., n-type silicon or another suitable conductor, to the n-regions 20. In the preferred embodiment of FIG. 3, each of the lower pn junctions 14*b* is excited by its own voltage waveform. Adjacent devices are isolated electrically by the isolation trenches 28 having lengths exceeding the maximum length of the depletion regions of the lower pn junctions when they are reverse-biased. The upper pn junctions 14*a* continue to be driven by a common waveform in a manner similar to that of FIGS. 1, 2A and 2B. The array 10*a* of FIG. 3 provides an addressable array of devices of the invention. Turning off any of the microplasmas of FIG. 3 during any voltage cycle requires only setting $V_{B2}$=0 during that cycle. Artisans will appreciate that the contacts 30 can form part of a circuit interconnection pattern. The processes used to form small and large arrays, such as the array 10*a*, leverage standard semi-conductor fabrication techniques. Such techniques can be used to form complex contact/electrode patterns to interconnect different ones of the individual devices in the array.

Figure 4:
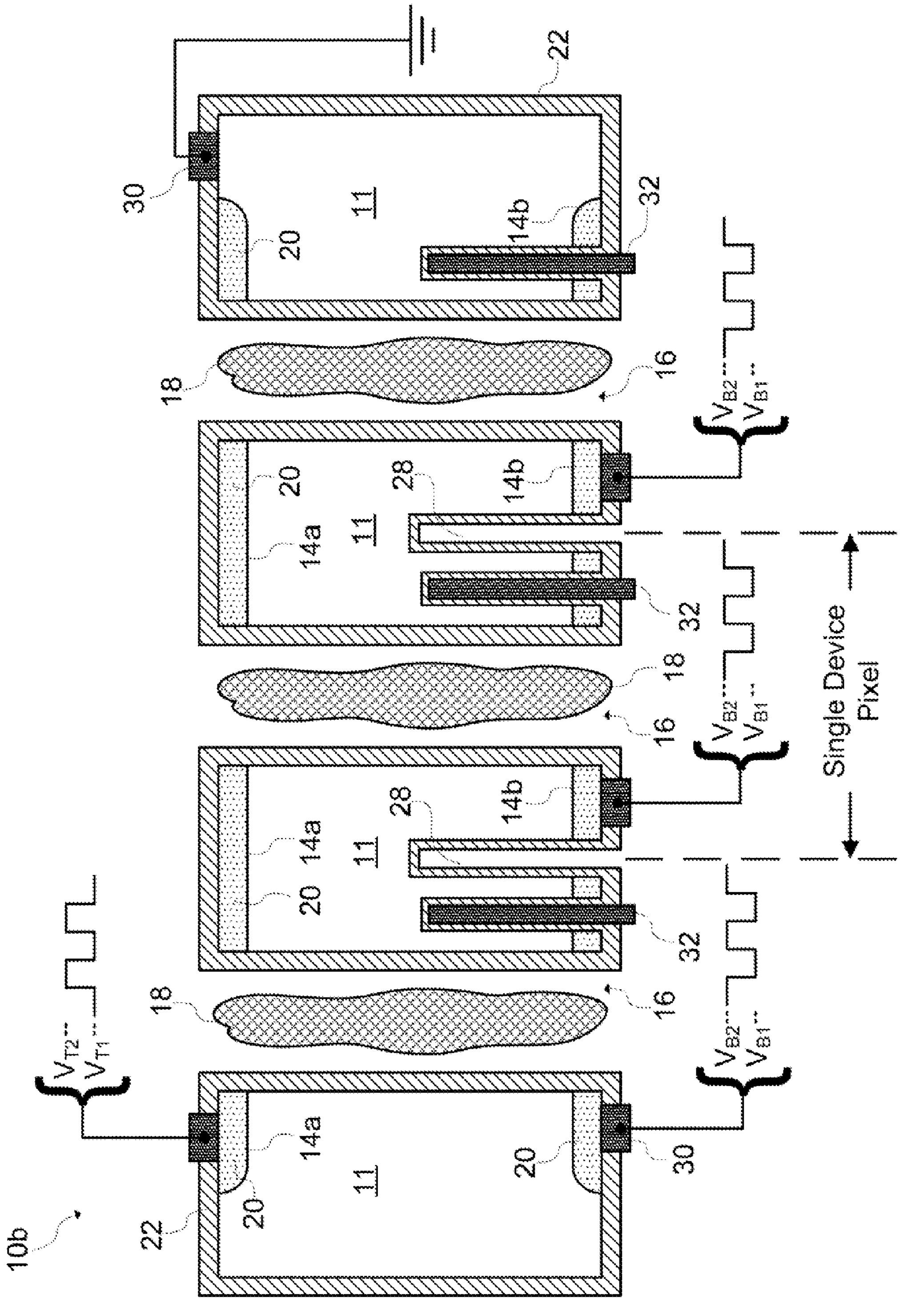
FIG. 4 is a schematic cross-sectional view of an another preferred embodiment array of semiconducting microcavity plasma devices that include a tertiary control electrode.

Another preferred embodiment array 10*b* is shown in FIG. 4 and adds a tertiary control electrode 32. The function of this tertiary control electrode 32 is to control the region within the microcavity 16 in which a microplasma is generated. Application of a positive voltage of sufficient magnitude to the tertiary control electrode 32 will induce an n type region around it. This serves to effectively extend the lower n-type region 20 further into the cavity of the device and reduce the distance over which the negative charges in the microplasma 18 migrate, thereby varying the properties and brightness of the microplasma 18 for that pixel, (i.e., an individual microplasma). In this manner, the brightness of a pixel can be modulated without varying the drive voltages ($V_{T2}$ and $V_{B2}$).

For the purposes of driving the aforementioned devices, it may be desirable to apply a low positive voltage on the non-driven n-region 20 during the $V_{T1}$ and $V_{B1}$ stages of the driving waveform (instead of simply shorting these regions with the p-type substrate) in order to control the migration of cavity electrons 24. This may play a crucial role during the off-state of a plasma pixel and reduce unwanted plasma excitation.

Figure 5:
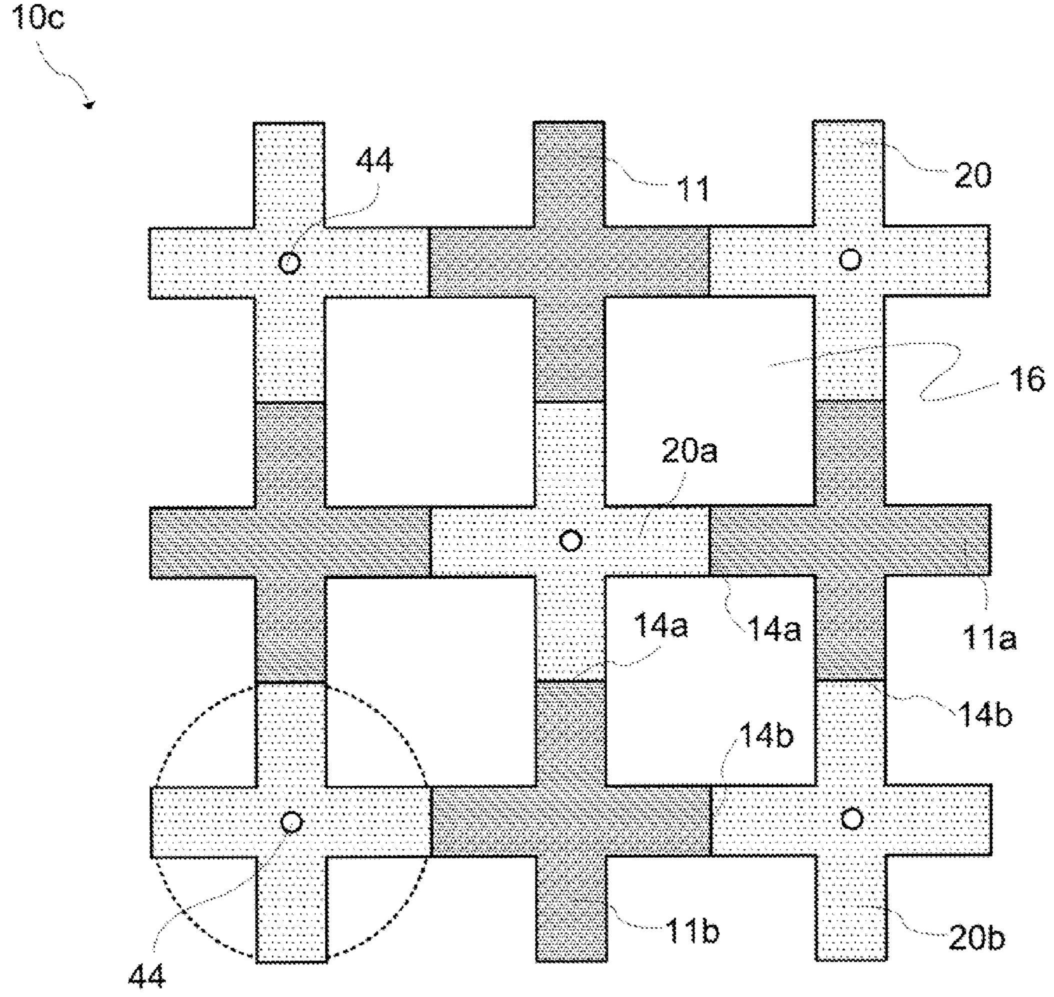
FIG. 5 is a schematic plan view of an another preferred embodiment array of semiconducting microcavity plasma devices in which microplasmas are generated within square or rectangular microcavities.

Another preferred array 10*c* of FIG. 5 includes a network of n-type doped Si regions 20 and p-type regions 11, each having the shape of a cross defined around square or rectangular microcavities 16. In an example embodiment, the n-type doped Si regions 20 and p-type regions 11 can be defined in a silicon layer that is upon a dielectric substrate and the microcavities 16 can extend up to and/or partially or completely extend through a supporting dielectric substrate (shown in FIGS. 6A-6N. Arranged as shown in FIG. 5, n-Si regions 20 and p-Si regions 11 are disposed so as to form four pn junctions 14 bordering each square or rectangular microcavity 16. Microplasmas are generated in the microcavities 16 by driving the pn junctions 14*a* and 14*b* on opposite sides of a given microcavity with alternate half-cycles of a time-varying voltage waveform. As an example, a microplasma is generated in the cavity bounded by the pn junctions 14*a* and 14*b* by grounding respective p-Si regions 11*a* and 11*b* and alternately applying a positive voltage to n-Si regions 20*a* and 20*b*. In this manner, microplasmas can be produced in any or all of the microcavities in the network illustrated in FIG. 5. Typical values for the dimensions of FIG. 5 are: 1) the width a of each arm of every cross is nominally in the 1-50 μm range, 2) the microcavity area can be varied readily from 10×10 $\mu m^2$ to 1×1 $mm^2$, and 3) the thickness of the n- and p-type regions is typically in the range of 10 μm to 500 μm.

Figures 6A, 6B, 6C, 6D, 6E, 6F, 6G, 6H, 6I, 6J, 6K, 6L, 6M, 6N:
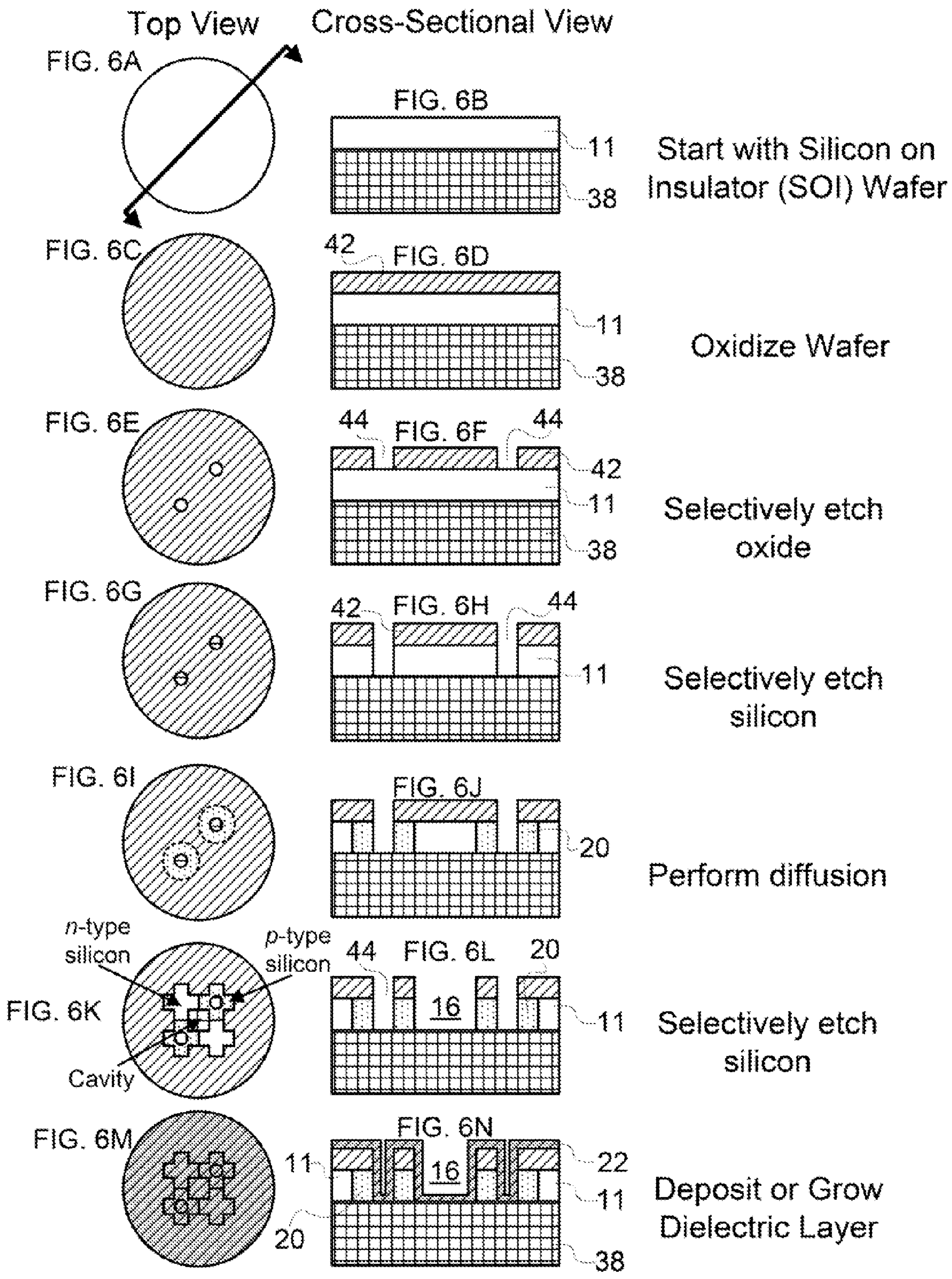
FIGS. 6A-6N illustrate a preferred method for fabricating semiconducting microcavity plasma devices and arrays in accordance with the device of FIG. 5.

A preferred fabrication process for forming the microcavity plasma array of FIG. 5 is shown in FIGS. 6A-6N. FIGS. 6A and 6B show a silicon on insulator wafer having a silicon wafer 11 upon an insulator/dielectric 38. In FIGS. 6C and 6D, the top of the silicon wafer 11 is oxidized with oxide 42 being formed. In FIGS. 6E and 6F, a patterned etch of the oxide 42 is conducted, and the pattern defined in the oxide is used to form diffusion holes 44 (also shown in FIG. 5) in the silicon wafer 11 in FIGS. 6G and 6H. Diffusion is conducted in FIGS. 6I and 6J to form n-type regions 20, and the extent of a counterdoped n-type region encompassing one diffusion hole 44 is shown qualitatively by the dashed circle at the lower right of FIG. 5. Dopants introduced into one of the holes proceeds radially outward, establishing a pn junction 14 (FIG. 5). A second selective etch of silicon defines microcavities 16 in the silicon wafer 11 in FIGS. 6K and L. Formation of a dielectric layer 22 in FIGS. 6M and 6N completes the array 10*c* of FIG. 5. Thus, based on processing Silicon on Insulator (SOI) wafers having p-type Si, the process sequence of FIGS. 6A-6N entails counterdoping a circular region surrounding each of the diffusion holes of FIG. 5.

Figure 7:
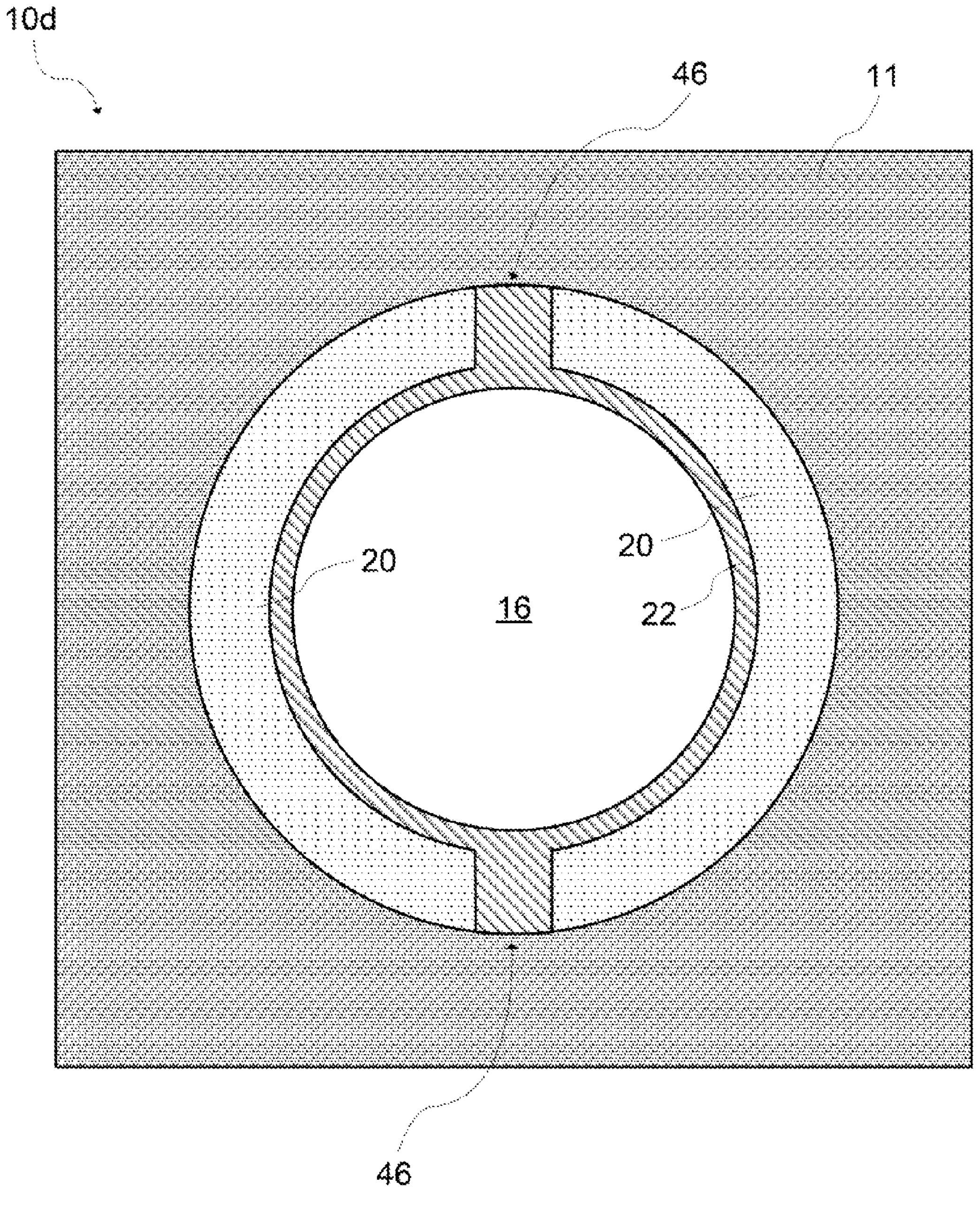
FIG. 7 is a schematic plan view of another preferred embodiment semiconducting microcavity plasma device having a pn junction cross-section in the form of a crescent.
Figure 8A:
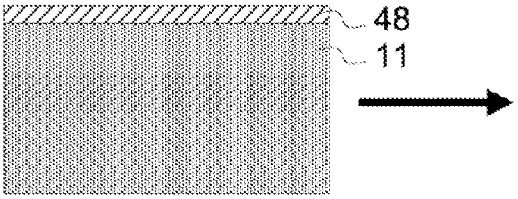
FIGS. 8A-8G illustrate a preferred method for fabricating semiconducting microcavity plasma devices and arrays in accordance with the device of FIG. 7.
Figure 8B:
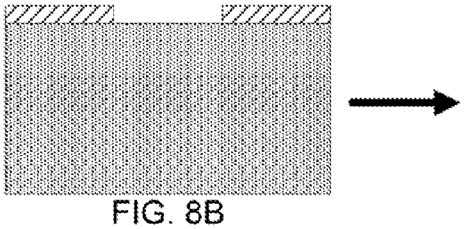
Figure 8C:
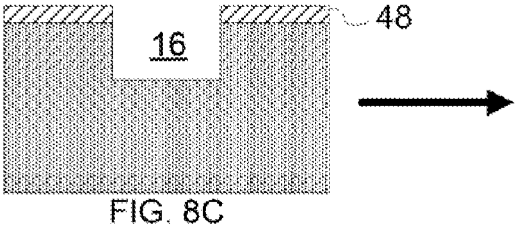
Figure 8D:
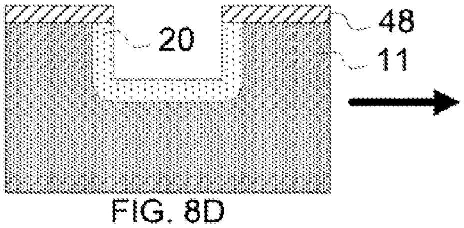
Figure 8E:
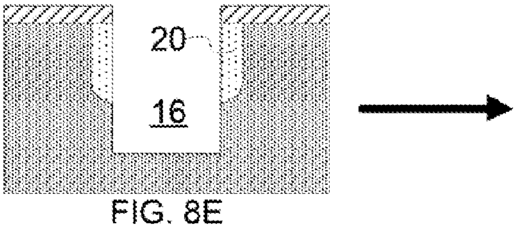
Figure 8F:
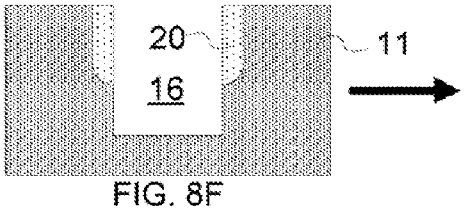
Figure 8G:
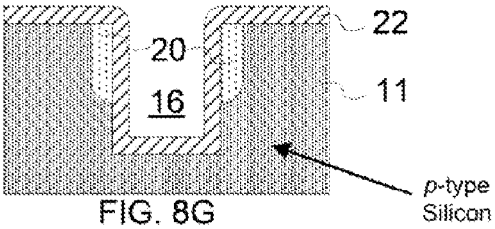

FIG. 7 shows another preferred embodiment array 10*d*, with two pn junctions 14*a* and 14*b* fabricated in the form of semicircles separated by a gaps 46. After forming a cylindrical microcavity 16 in a p-type Si substrate 11, an n-type region 20 is formed, typically by diffusion. This process produces a continuous, n-type region extending into the wall of the microcavity 16. Subsequent etching forms the gaps 46 in the n-type region 20 to create the semi-circular n-type regions 20. Dielectric 22 fills the gaps 46 in addition to coating the cavity 16 and therefore isolates the semi-circular n-type regions from each other to create the separate pn junctions 14*a* and 14*b*. Contacts such as those illustrated in FIGS. 3 and 4 are easily formed to contact the n-type regions 20 and the p-type substrate 11.

FIG. 8 illustrates a preferred fabrication process for making a device such as the device 10*d* shown in FIG. 7 (or any array of devices like the device 10*d* shown in FIG. 7). In FIG. 8A, wafer, such as a silicon wafer 11, is oxidized to form an oxide layer 48. A pattern is etched the oxide layer 48 in FIG. 8B and a partial etch of the silicon substrate 11 is conducted according to the oxide patter in FIG. 8C. The partial etch of FIG. 8C forms part of the microcavity 16. Use of the initial partial etch instead of fully etching the microcavity 16 in the first step serves to control the extent of the pn junction 14 along the microcavity because the diffusion conducted in FIG. 8D to form n-type regions 20 is defined by the depth of the initial partial etch. A mask is used to remove the oxide defining the notches separating the two n regions from each other and the notches are etched at the same time as when the microcavity 16 is later etched to its full depth in FIG. 8E and then oxide is removed in FIG. 8F. Oxidation or deposition to create the dielectric layer completes the basic device structure, and subsequent conventional steps can be performed to create electrodes/contacts and patterns of the same.

Figure 9:
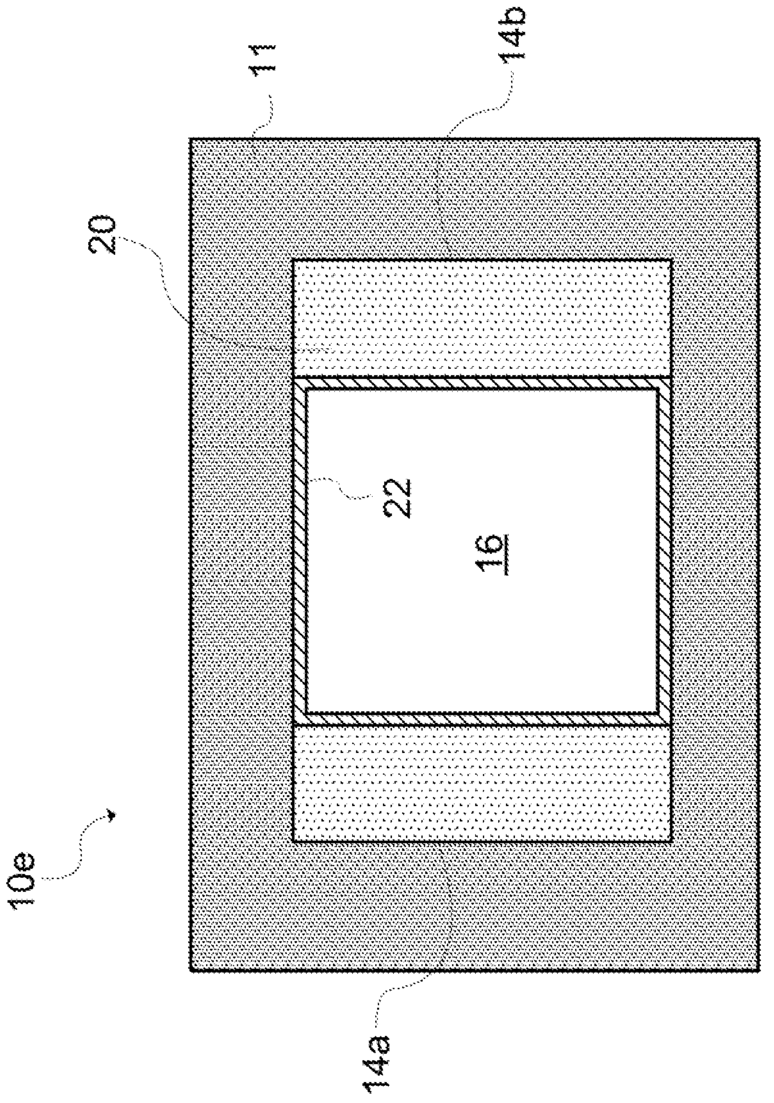
FIG. 9 is a schematic plan view of another preferred embodiment semiconducting microcavity plasma device in which the microcavity is square or rectangular in cross-section.

FIG. 9 is a schematic diagram in plan view of another preferred embodiment microcavity plasma device 10*e* of the invention in which the microcavity 16 is square or rectangular in cross-section. Two pn junctions 14*a* and 14*b* are again separated by a microcavity 16 and n-type regions 20 are formed on either side of the microcavity, preferably by a diffusion process. The dielectric film 22 will facilitate the storage of charge from one half-cycle of the driving voltage to the next. As with all other embodiments shown previously, a mixture of gas(es), vapor(s), or a combination thereof is introduced to the cavity. For the appropriate magnitude of the voltage driving the pn junctions, microplasma will be produced in the microcavity 16.

Figure 10:
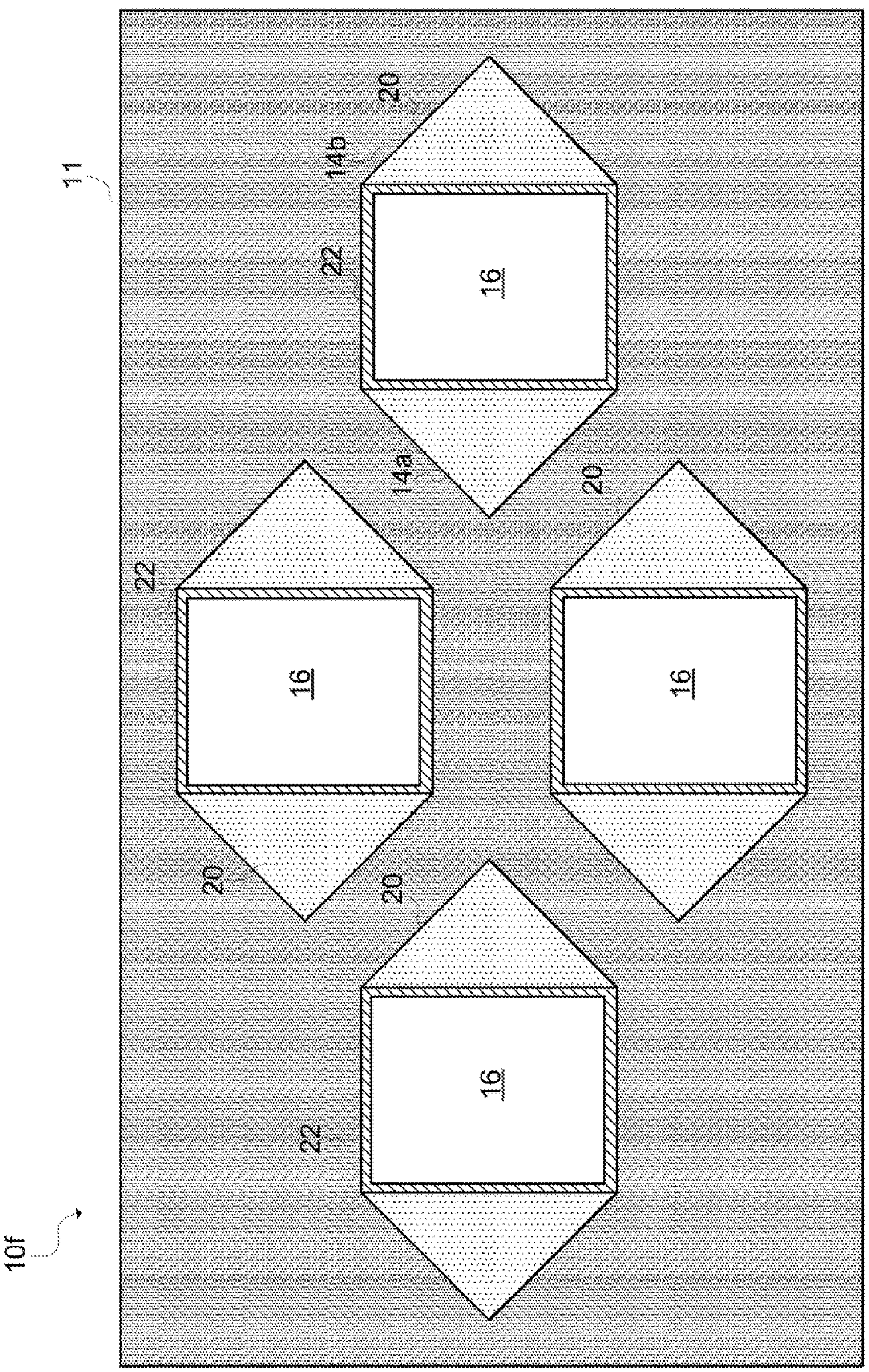
FIG. 10 is a schematic plan view of another preferred embodiment array of semiconducting microcavity plasma devices in which the microcavities have a square or rectangular aperture.

FIG. 10 shows another preferred embodiment array 10*f* of microcavity plasma devices that have microcavities 16 that are either square or rectangular in cross-section. Artisans will recognize that the design of FIG. 10 can be modified so as to have the pn junctions 14*a* and 14*b* arranged in the form of a hexagon, which permits a higher packing density. While this is unlikely to be used with current display driver circuitry, the tighter packing density might be used with modified driving circuit layouts to produce individually addressable, tightly packed pixels. Additionally, the array 10*f* could provide, for example, very bright light source in which groups of pixels or all of the pixels in the array 10*f* are driven together. The array 10*f* can be driven, for example, by grounding the p-type regions 11 associated with each junction 14 and driving pairs of opposing n-type regions with alternate half-cycles of a voltage waveform. Artisans will recognize various fabrication options for the oxide regions 20. One method would be to oxidize the silicon wafer 11 and then remove the oxide over the desired n regions. An n type predep and diffusion are then performed to produce the n type regions and oxidize the wafer. The oxide is then removed from the regions where the cavities will be formed and the cavities are then etched. The wafer is once again oxidized to coat the pn junctions with dielectric. Oxide is then removed where it is desired to make electrical contact to the p and n type regions.

Figure 11A:
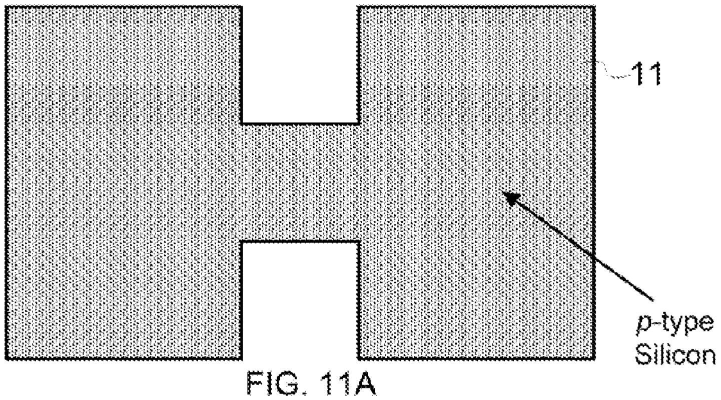
FIGS. 11A-11C illustrate a preferred method for fabricating semiconducting microcavity plasma devices having a pn junction extending along at least a portion of the length of the microcavity or microchannel.
Figure 11B:
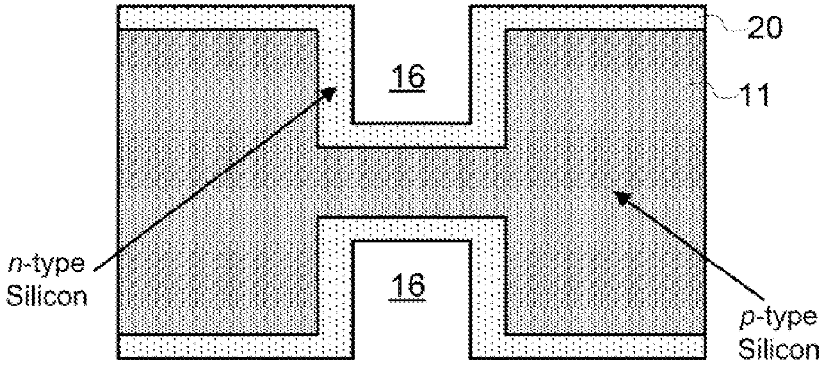
Figure 11C:
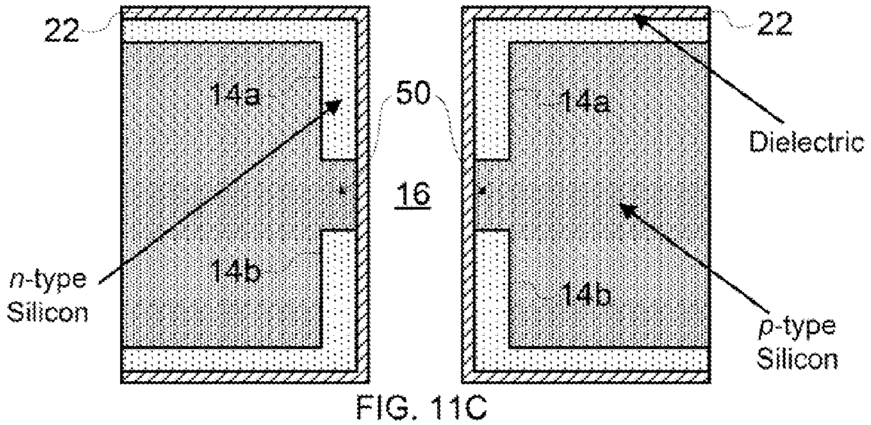

Preferred modified microcavity plasma devices similar to those shown in FIGS. 1-4 have pn junctions 14*a*, 14*b* that extend into the microcavity 16 from both the top and bottom of the device. FIGS. 11A-11C present a sequence of processes by which two pn junctions 14*a*, 14*b* extending partially into a microcavity 16 can be fabricated. Junctions 14*a* and 14*b* originating from the top and bottom of the p-type substrate 11 extend into the microcavity 16 but do not meet at the center and are separated by a gap 50. The gap 50 between the ends of the pn junctions 14*a*, 14*b* in the microcavity is adjustable during fabrication by the depth of a partial etch conducted in FIG. 11A. The diffusion conducted in FIG. 11B creates the n-type regions that extend into the partially formed microcavity 16. The p-type material between the upper and lower portions of the partially formed microcavity 20 defines the size of the gap 50. Etching in FIG. 11C followed by dielectric formation completes the microcavity 16. As in previous embodiments, the upper and lower pn junctions 14*a* and 14*b* can be driven by alternate half-cycles of a time-varying voltage waveform.

Figure 12:
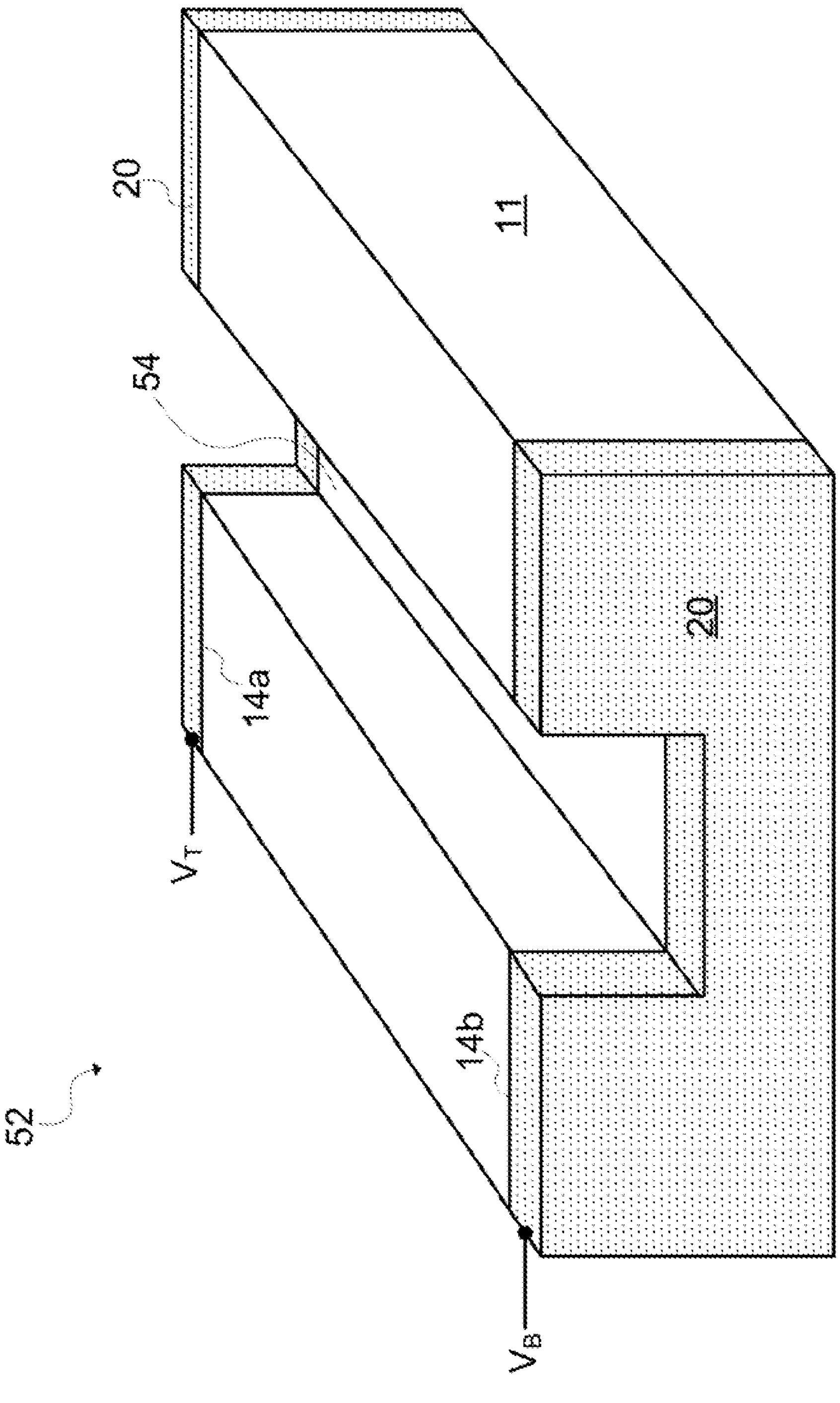
FIG. 12 is a schematic diagram of a preferred embodiment semiconducting plasma device having a square or rectangular microchannel for forming a microplasma.

Another preferred embodiment device is a microchannel based device. FIG. 12 shows a microchannel device 52 of the invention. A microchannel 54 is formed in a semiconductor substrate, such as a silicon substrate 11. Separate pn junctions 14*a* and 14*b* are formed at opposite ends of the microchannel 54 by n-type regions 20. Though omitted for clarity of illustration, a dielectric layer can be formed over the device 52 as in other embodiments. Although the microchannel 54 is shown as having a rectangular cross-section, other cross-sectional geometries are readily achieved with microfabrication techniques well know in the art. A preferred example alternative microchannel has a v-shaped cross-section.

Figure 13:
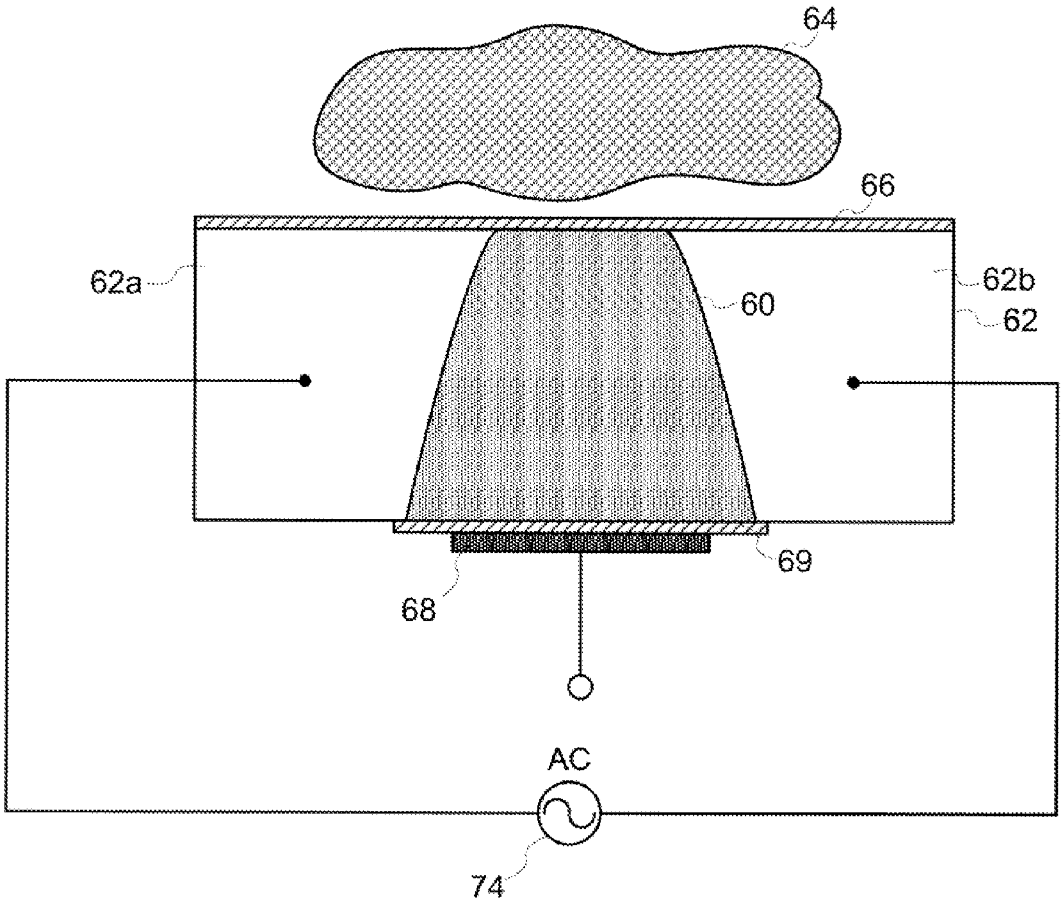
FIGS. 13 and 14 are schematic cross-sectional diagrams of preferred embodiment semiconducting plasma devices in which the extent of the n and p regions are controlled by a gate electrode.
Figure 14:
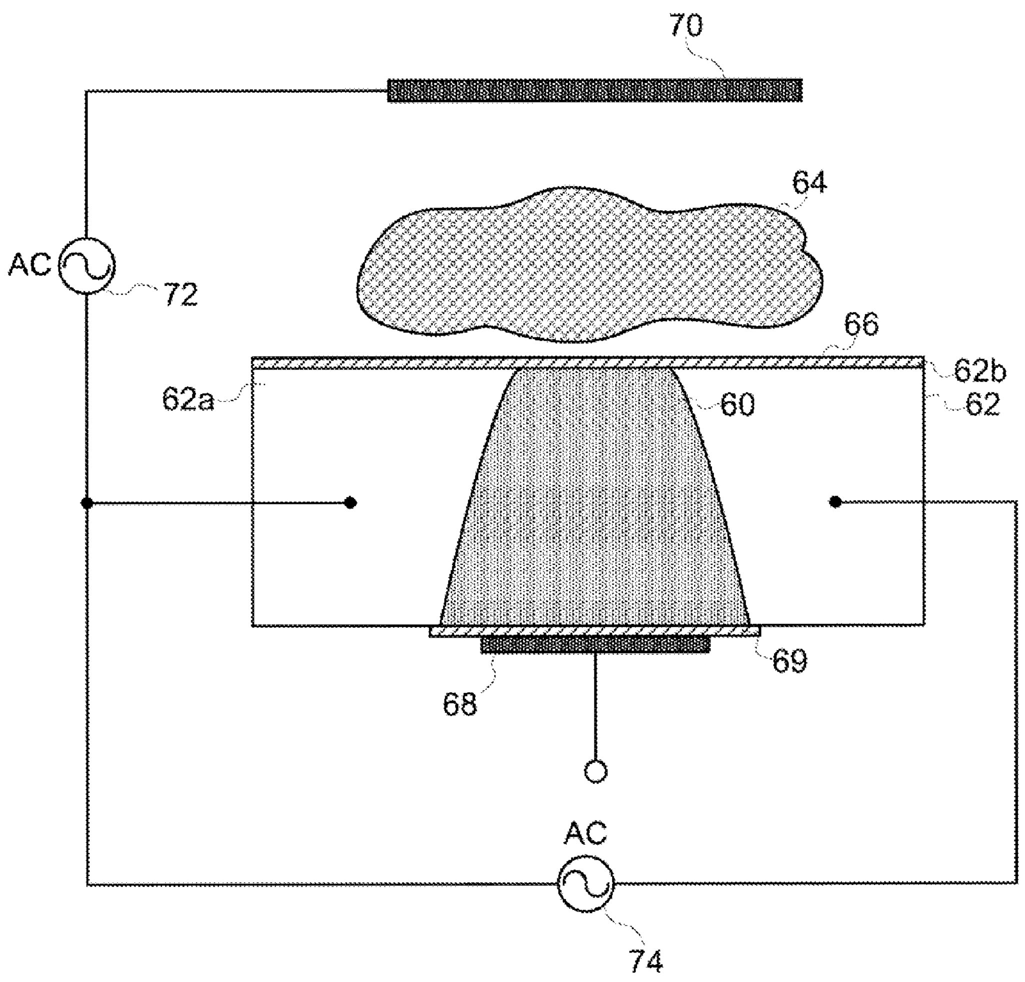

While microcavity and microchannel devices are separate important preferred embodiments because the respective microcavities and microchannels confine plasma in manners that contribute to plasma generation efficiency, other embodiments of the invention generate a microplasma proximate to a pn junction. FIGS. 13 and 14 are examples of these latter types of microplasma-semiconductor devices in which p-type regions 60 are diffused into n-type substrates 62 to form two n-type regions 62*a* and 62*b* separated by the p-type region 60. Microplasma 64 is produced above the upper surface of the n-type semiconductor 62, which is coated with a thin dielectric layer. Microplasma is generated between the two n regions in a manner analogous to the plasma generation in FIG. 2. Application of a positive voltage of sufficient magnitude to a gate electrode 68 effectively increases the extent of the p region 60, thus increasing the separation between the n regions 62. This causes the electrons in the microplasma to travel farther thereby increasing the extent of the microplasma. In FIG. 13, microplasma is generated immediately above the upper dielectric film 66 by the potential difference that exists between the two n-type regions. In FIG. 14, an external electrode 70 is used, and a second driving signal voltage 72 applied to the electrode 70 serves the purpose of controlling the microplasma parameters independent of a first signal voltage 74.

Figure 15:
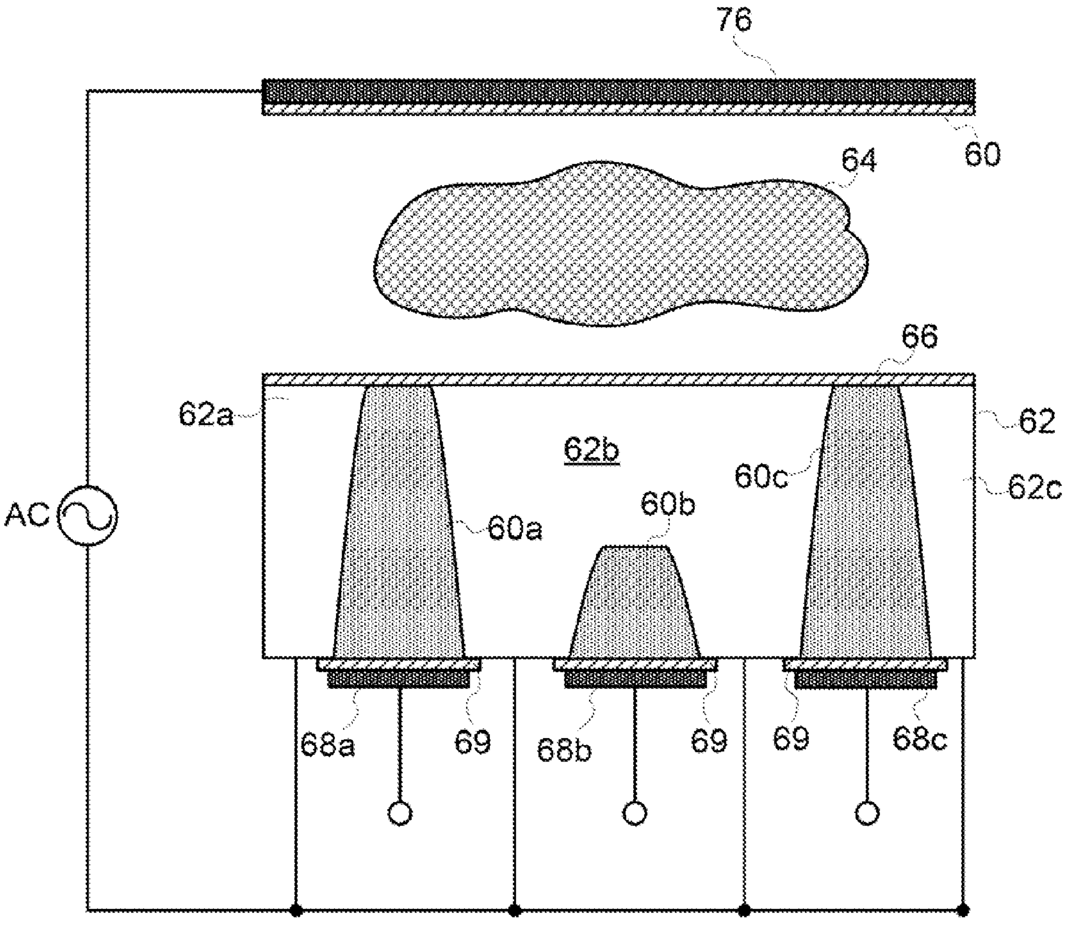
FIG. 15 is a schematic diagram of a preferred embodiment semiconducting microcavity plasma device in which the lateral conductivity of the plasma can be controlled by any one or all of the voltages on a plurality of separate gates.

FIG. 15 is a cross-sectional diagram of another preferred embodiment microplasma device of the invention that is similar to the FIGS. 13 and 14 devices, but has multiple p-type regions 60*a*, 60*b*, and 60*c* diffused into an n-type substrate 62. In this embodiment, the extent of the p-type diffusions 60*a*, 60*b*, 60*c* into the substrate 62 is shown as being different for each p-type region 60*a*, 60*b*, 60*c*. In other embodiments, all of the diffused p-type regions of FIG. 15 may be of the same shape. The effective shape and extent of the p regions may also be adjusted at will by the application of voltages to the respective gates 68*a*, 68*b*, 68*c* that are isolated from the p regions by gate dielectric 69. Application of a negative voltage of sufficient magnitude to a gate serves to extend the p region while the application of a positive voltage to a gate reduces the extent of the p region. Microplasma is produced by applying a time-varying voltage between the n regions 62*a*, 62*b*, 62*c* of FIG. 15 and an external electrode 76, which can be a transparent electrode such as ITO having a dielectric layer 66 facing the microplasma. If the electrode 76 is formed from a transparent material such as indium tin oxide (ITO), visible emission produced by the microplasma 64 will be transmitted by the upper (ITO/dielectric) electrode. During the positive half cycle of the time-varying driving voltage waveform, negative charges in the microplasma 64 are attracted to the top electrode 76. Upon application of the negative half cycle of the voltage waveform, the n regions 62*a*, 62*b*, 62*c* are initially at a positive potential and a depletion region exists between the n and p regions until sufficient leakage current flows into the p regions 60*a*, 60*b*, 60*c* to also charge those regions positive. During the initial phase in which the n regions 62*a*, 62*b*, 62*c* are positive and the p regions 60*a*, 60*a*, 60*c* are negative, electrons between the ITO electrode 76 and the dielectric layer 66 on the n-type substrate 62 will be accelerated toward the n regions 62*a*, 62*b*, 62*c*, thus producing microplasma predominately above the n regions 62*a*, 62*b*, 62*c*. In this manner, the extent of the microplasma may be controlled by the gate voltages. In the embodiment of FIG. 15, the conductivity of the microplasma 64 (and, hence, microplasma emission) will, for a given gate voltage, vary along the lateral coordinate (i.e., parallel to the dielectric layers of FIG. 15) of the device. Because of the visible transmission of the ITO electrode and the control of the spatial extent and brightness of the microplasma afforded by the gate electrodes, this structure is well-suited for use in a display comprising many of the devices of FIG. 15.

While specific embodiments of the present invention have been shown and described, it should be understood that other modifications, substitutions and alternatives are apparent to one of ordinary skill in the art. Such modifications, substitutions, and alternatives can be made without departing from the spirit and scope of the invention, which should be determined from the appended claims.

Various features of the invention are set forth in the appended claims.

The invention claimed is:

1. A semiconducting microcavity or microchannel plasma device, comprising a microcavity or microchannel and a pn junction proximate said microcavity or microchannel arranged with respect to said microcavity or microchannel to generate a plasma in said microcavity or microchannel between said pn junction and a thin dielectric barrier on walls of said microcavity or microchannel separating said pn junction from said microcavity or said microchannel so that electrons are generated on a surface of said dielectric within said microcavity or microchannel during periods of reverse biasing of said pn junction and diffuse away from each other along said surface of said dielectric during periods when reverse biasing is removed.

2. The device of claim 1, wherein said pn junction comprises at least two pn junctions that are timed by upper and lower n-type semiconductor regions within p-type semiconductor material.

3. The device of claim 2, further wherein said dielectric layer barrier completely covers said microcavity or microchannel and said pn junctions.

4. The device of claim 2, wherein said microcavity or microchannel comprises a microcavity and said least two pn junctions comprise a first pn junction disposed around a top portion of said microcavity and a second pn junction disposed around a bottom portion of said microcavity.

5. The device of claim 4, wherein said microcavity penetrates a p-type substrate and said first and second pn junctions are formed by first and second n-type regions within said p-type substrate around said top and bottom portions of said microcavity.

6. The device of claim 5, wherein said first and second n-type regions extend into said microcavity along walls of said microcavity.

7. The device of claim 5, further comprising electrodes to contact said n-type regions and said p-type substrate.

8. The device of claim 7, further comprising a tertiary control electrode extending into the p-type substrate through one of said first and second n-type regions.

9. The device of claim 4, further wherein said dielectric is over walls of said microcavity.

10. An array of devices according to claim 4.

11. The array of claim 4, further comprising trenches that isolate n-type regions associated with adjacent microcavities to create individually addressable devices in the array of devices.

12. The device of claim 2, wherein said microcavity or microchannel comprises a microcavity and said least two pn junctions comprise a first pn junction disposed partially around a top portion of said microcavity and a second pn junction disposed partially around a said top portion of said microcavity.

13. The device of claim 12, wherein said first and second pn junctions are isolated from each other by a gap.

14. The device of claim 13, wherein said gap comprises a dielectric filled gap.

15. The device of claim 2, wherein said upper and lower n-type semiconductor regions within p-type semiconductor material are at opposite ends of said microcavity or microchannel.

16. The device of claim 1, wherein said microcavity or microchannel comprises a square or rectangular cross-section microcavity and said pn junction comprises a plurality of pn junctions that are formed by cross-shaped n-type and p-type regions.

17. An array of devices of claim 16.

18. The array of claim 17, wherein the n-type and p-type regions are formed in a p-type wafer that is bonded to an insulator in a silicon-on-insulator stack.

19. A method for creating a conduction channel with a pn junction proximate a microcavity or a microchannel and isolated by a thin dielectric layer, the method comprising steps of:

reverse biasing the pn junction with a voltage sufficient to generate electrons on the dielectric layer and drive a plasma in the microcavity or microchannel;

removing the reverse bias to permit electrons to diffuse along the dielectric layer and extend plasma in the microcavity or microchannel in a second cycle; and alternately repeating said steps of reverse biasing and removing to maintain a plasma.

20. The method of claim 19, wherein the pn junction comprises at least two pn junctions isolated from each other by a p-type region, and wherein, said reverse biasing reverse biases a first one of the two pn junction with a voltage sufficient to drive a plasma in the microcavity or microchannel; and said step of removing comprises reverse biasing the second one of the two pn junctions with a voltage sufficient to drive a plasma in the microcavity or microchannel in a second cycle while shorting the first one of the two pn junctions.

21. A semiconducting microplasma device, comprising:

a pn junction defined in a p-type region of semiconductor material;

a thin dielectric separating said pn junction from a microplasma generation area above said pn junction;

a gate electrode separated from said p-type region by gate dielectric; and a voltage source for applying a time varying voltage bias to said pn junction.

22. The device of claim 21, comprising at least two pn junctions formed by at least two n-type regions separated by said p-type region; wherein said thin dielectric separates said at least two n-type regions and said p-type region from said microplasma generation area above said at least two n-type regions and said p-type region.

23. The device of claim 22, further comprising a gate voltage source to apply a potential to said gate electrode and control the extent of said p-type region.

24. The device of claim 22, comprising a plurality of p-type regions and a plurality of respective gate electrodes.

25. The device of claim 21, further comprising an external electrode disposed opposing said thin dielectric.

26. The device of claim 25, wherein said external electrode comprises a transparent electrode.

* * * * *

UNITED STATES PATENT AND TRADEMARK OFFICE

CERTIFICATE OF CORRECTION

PATENT NO. : 8,492,744 B2
APPLICATION NO. : 12/915630
DATED : July 23, 2013
INVENTOR(S) : Eden et al.

It is certified that error appears in the above-identified patent and that said Letters Patent is hereby corrected as shown below:

<u>In the Specification</u>:

Col. 4, line 58 Please delete "$V_T > 0$" and insert --$V_{T2} > 0$-- therefor.

Signed and Sealed this
Tenth Day of December, 2013

Margaret A. Focarino
*Commissioner for Patents of the United States Patent and Trademark Office*